United States Patent
Chen et al.

(10) Patent No.: US 7,690,930 B2
(45) Date of Patent: Apr. 6, 2010

(54) ELECTRICAL CONNECTION BETWEEN CABLE AND PRINTED CIRCUIT BOARD FOR HIGH DATA SPEED AND HIGH SIGNAL FREQUENCY

(76) Inventors: Hubert Chen, Flat 602, Building No.21, Jiu Ru Tong Jin, Lijiang Huayuan, Dashi Panyu, Guangzhou, 511431 (CN); Ascanio Orlandini, Via Dogali, 25, 26013 Crema (CR) (IT)

( * ) Notice: Subject to any disclaimer, the term of this patent is extended or adjusted under 35 U.S.C. 154(b) by 0 days.

(21) Appl. No.: 12/253,623

(22) Filed: Oct. 17, 2008

(65) Prior Publication Data
US 2009/0104813 A1   Apr. 23, 2009

(30) Foreign Application Priority Data
Oct. 17, 2007   (IT) ................ CO2007A0034

(51) Int. Cl.
*H01R 12/00*   (2006.01)

(52) U.S. Cl. ..................................... 439/76.1
(58) Field of Classification Search .............. 439/76.1
See application file for complete search history.

(56) References Cited

U.S. PATENT DOCUMENTS

| 2006/0134946 A1* | 6/2006 | Vermeersch et al. | 439/76.1 |
| 2007/0111597 A1* | 5/2007 | Kondou et al. | 439/581 |

* cited by examiner

*Primary Examiner*—Ross N Gushi
(74) *Attorney, Agent, or Firm*—Young & Thompson

(57) ABSTRACT

A direct galvanic connection between a cable, having a preferred flat cross-section, and an electronic Printed Circuit Board ("Target PCB") (228) by means of an intermediate PCB ("Interconnection PCB") (200) allowing an impedance matched and length balanced electrical connection is described, thus offering ideal conditions for high speed and high frequency data connections. At the same time, the connection allows to keep the flexibility of a modular production and assembly workflow, typical of the use of well known connectors.

20 Claims, 5 Drawing Sheets

ELECTRICAL CONNECTION BETWEEN CABLE AND PRINTED CIRCUIT BOARD FOR HIGH DATA SPEED AND HIGH SIGNAL FREQUENCY

DESCRIPTION OF THE INVENTION

1. Field of the Invention

The described invention relates in general to high speed electrical signal connections, involving connections between cables with specific impedance rating and impedance matched printed circuit board (PCB) traces, according to the preamble of claim 1.

2. Background of the Invention

The functionality of many modern electronic devices often requires interconnecting different components through cable or wire links that carry high speed digital data. A common example can be the usage of external hard disk drives connected with USB cables, or even the connection of displays (computer monitors or TVs) using DVI or HDMI digital video connections. Current trend in the industry is to keep increasing the signal frequency to reach higher speeds, and to use serial data transfer approach, that again involves higher speed/frequency of electrical signals, often propagated on two wires (a wire pair or multiple wire pairs to multiply the data throughput.) Often it is used a so called "differential" mode making the signal more robust to interferences. The key aspect in dealing with high speed/high frequency electrical signals is to provide an electric connection with an accurate impedance that is kept as constant as possible through all the path. This is referred as "impedance matched connection". In other words, the more the speed/frequency of a signal is increased, the more it is critical that the impedance of the electrical connection the signal is traveling upon is kept accurate, without discontinuities. Any impedance discontinuity on the path, in fact, generates a reflection of the electrical signal or of a portion of it. Such reflections add up to the electrical waveform of signal itself, causing random errors in the data at the receiving endpoint of the connection. The errors are usually detected by complex error detection and correction algorithms, that can trigger data retransmissions. Ultimately the user suffers, depending on the nature of the data delivered, a slower transmission line or, in case of real time audio/video transmissions, less overall perceived quality. Another important factor to keep under control is the data line wires total length. In addition to these quality effects, the mentioned impedance discontinuities and/or length differences of wires creating a differential encoded high speed transmission line can originate electromagnetic interference (EMI) due to irradiation of energy by means of electro magnetic waves. These EMI not only create an unwanted effect that has to be minimized to safeguard EMI pollution and to obey to national and international standards such as FCC and CE, but also subtract energy for the meaningful signal, making it more weak and subject to additional vulnerability to the above mentioned negative effects.

It is common experience that cables are connected to PCBs or, in general, hardware devices using different kind of connectors: Headphones attach to MP3 players with stereo audio jacks, mice attach to computers with serial RS232, PS/2 or USB connectors, monitors link to graphics cards or other audio/video devices with electrical analog (CVBS, SCART, VGA) or digital (DVI, HDMI) connections.

It is also common experience that the greater the speed and frequency of data is involved, the more the connector is getting sophisticated, cumbersome, complex, expensive. This is because fast signals require a higher care in the connector assembly to preserve the signal integrity, taking care of aspects like the continuity of the electrical impedance and keeping the same length of the electrical paths through the connector. With the progressive increase of the data transfer speeds and the reduction in the mechanical dimensions of the interconnections, being able to produce connectors meeting market needs will be more and more difficult for connectors and cables manufacturers, also taking into account that there is a consistent manual labor involved in the process.

Alternatively, the standards that create the foundations of signal protocols can take into account a specific amount of impedance discontinuity and compensate it, at the cost of some less performance and efficiency. For example, the DVI signaling protocol used to connect digitally LCD displays takes into account the possible signal degradation due to two connectors by keeping an appropriate reserve and imposing some physical constraints that impact on limited cable length.

See FIG. 1 as example of current (prior art) solution. Cables are always combined with one connector at each end.

The electronics manufacturing industry is highly specialized. Specifically the capabilities and skills of cable manufacturing factories and PCB component assembly factories are very specific and well different. The first kind is specialized in assembling different kind of electrical cables, the second kind instead is specialized to solder electrical components on PCBs to assemble final electronics products. Productive processes, skills and know-how are very different and mostly not overlapping between these two categories. This also explains why cables almost always feature connectors at both ends: this allows each of the two kind of factories to deliver a final work using their own skills. PCB assembly factories can consider cables as standard parts and don't need to develop the skills required to solder cables to PCBs. Cables handling technology is instead is kept and developed by specialized cable factories Another meaningful example can be observed giving a closer look to a typical digital video (DVI) cable. The DVI standard (DWWG group, version 1.0) foresees a maximum transfer speed of 1.65 Gbps, properly encoded. Even if the specifications are not exhaustive regarding the maximum allowed cable length difference for the electrical wires creating a differential line data pair with constant impedance, the common experience shows that a difference in the range of +/−1 mm are allowed. A 1 mm difference can appear huge from the viewpoint of a PCB layout engineer. Instead it is already a big challenge to meet from the view point of a cable maker. In the cable making industry, in fact, more often than expected each electrical wire is placed and soldered manually without the help of fixtures or other mechanical alignment devices. The simple fact to have to spread the wires of a cable to the connector solder points requires that some of the wires follow a longer path than others and therefore ensuring that the cable length difference, among several scattered wires, is less than 1 mm becomes an almost impossible task. To make things worse, as usually cables have one connector at each end, the errors at each end can in the worst case add up, so then having a total length difference below 2 mm (1 mm at each side) is almost impossible to control. Not being enough on length control and mismatch, also the mechanical mating between each couple of connectors should be taken into account, even if these mismatch are of much less entity. Additional consideration could be made related to the solder points of the connectors, that are in average 3 mm long and, to keep a 1 mm accuracy, a relative precision of 33% must be kept when placing and soldering each individual wire. All these precision levels cannot be verified by a visual control and test devices that can perform an automated/numeric verification are very expensive and most of the time not affordable to the vast majority of cable makers, especially since cables are seen as commodities with limited added value.

From all the above description it is clear how critical and complex it is to ensure the high standard levels required for manufacturing impedance matched cables when featuring connectors at their ends. The market trend goes for a progressive and unstoppable growth of the speeds in the game: Speeds of 2.5 Gbps are already currently in use and extensions to 5 Gbps are currently being standardized. We can expect that during the next 25 years connection speeds will grow up to 25 Gbps and beyond. As consequence there is an extreme need to find solutions to increase precision, reliability and easy reproducibility of interconnections between cables and electronic devices considering both the control of the overall electrical length (length balancing) and the overall electrical impedance continuity (impedance matching) through the complete connection, end to end, that ultimately means silicon to silicon.

SUMMARY OF THE INVENTION

The invention consists in an innovative solution allowing to couple cable and electronic devices, while keeping optimum electrical impedance continuity and length balancing among all or some of the individual wires of the electrical cable. At the same time, it preserves the manufacturing process workflow typical of the traditional connector based approach. Going into details, in this document we will identify the electronic device (at one or both ends of the cable) with the term "Target Printed Circuit Board" and abbreviated as "Target PCB". A new PCB is introduced and called "Interconnection PCB"

Once that the connection of the most critical electrical wires (usually high speed serial data line pairs with differential encoding) with the interconnection PCB have been completed properly, the invention here described allows to use traditional PCB routing techniques to reach the target PCB. The Interconnection PCB is then kept in place by a proper retention mechanism and connects to the target PCB by soldering (galvanic connection) the Interconnection PCB to the target PCB ("PCB edge solder connector"). Alternatively the interconnection PCB can become a connector by means of a molding process or directly soldering it to a traditional connector. The Intermediate PCB can attach to the Target PCB even by other means that are alternative implementation of the presented invention. Also, the Intermediate PCB can be the Target PCB. The Interconnection PCB can be made as simple as a thin two layers PCB having one layer as reference ground and the second layer as impedance matched and length balanced traces. The possibility to use a simple dual layer thin PCB allows to keep cost very low. Considering all the added advantages described in details in the following paragraphs, it is believed that the added cost due to the introduction of the Interconnection PCB is very well absorbed by the overall advantages and savings that this solution enables to the process.

The proposed solution is supported by a proper arrangement of the wires as the electrical wires in a flat section shape electrical cable, instead of the usual round section. The Interconnection PCB is designed in a way that individual wire solder pads are perfectly aligned with the arrangement of the wire in the flat cable. This layout and arrangement by itself removes the problem to rearrange each cable wire to its solder point, while also removing any possibility of mistake in the soldering order. In addition, both shielding braids and drain wires are properly collected and well kept in place with conductive gluing Copper Tape and soldered to the respective grounds: Shield Ground and Digital Ground. Advantages from mechanical, electrical, manufacturing and functional perspectives are several and evident: Extreme control over length balancing of each electrical wire with realistic possibility to reach precision of +/−0.1 mm, very reduced decoupling between wire and it's reference ground (in the range of 1 mm) with consequent advantage for a very uniform connection impedance, very easy visual inspectionability of each connection, very thin global assembly of the connection (less than 5 mm of thickness) with obvious mechanical advantages for the final application, higher reliability, higher automatization of the manufacturing process, resulting in a total cost reduction and higher quality.

Improving the mechanical placement of the cable and of the individual electrical wires ensures the following advantages at electrical and quality level of the transmitted signal: Low jitter, low electromagnetic interference (EMI) irradiated, very low impedance discontinuity (both time and space wise), very low impedance variation (Delta) over all the connection, return ground wires remain very close to the referenced signal wire, ensuring low EMI emission and low sensibility to external electromagnetic fields. Each of these advantages individually increases the quality of the transmission channel, granting signal integrity and simplifying the design of systems and circuits having transfer speeds of 2.5 Gbps or more.

The final result is a very solid and reliable connection between the cable and the final PCB, with the most perfect electrical impedance continuity.

BRIEF DESCRIPTION OF THE DRAWINGS

Further characteristics details and advantages of an electrical connection between a cable and a printed circuit board for high data speed and high signal frequency according to the invention shall become more readily apparent from the following description by way of examples hereafter and illustrated in the drawings, in which.

DESCRIPTION OF THE PREFERRED EMBODIMENTS

Figure 1A:
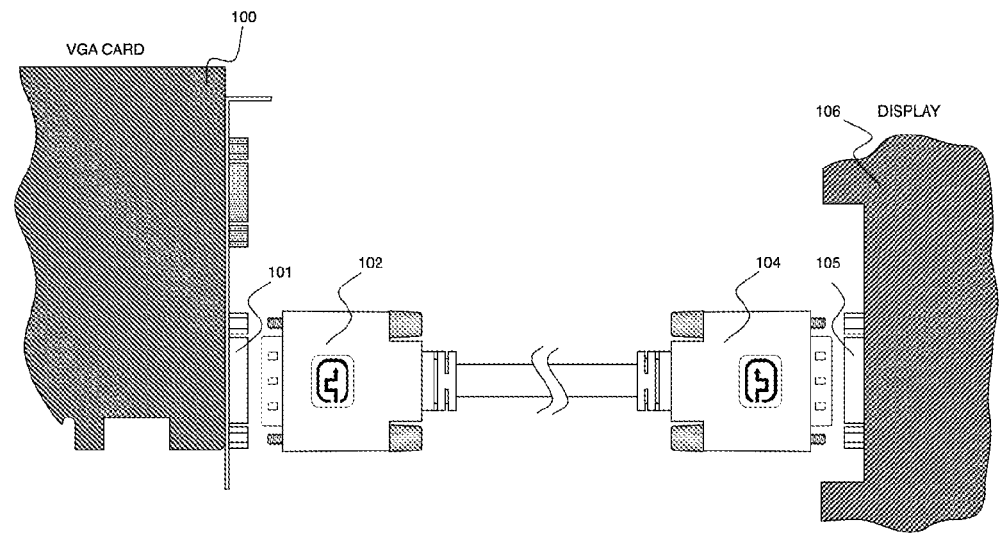
FIG. 1A: shows a prior art solution, showing a connection using a digital video DVI cable connecting a display with a computer system.
Figure 1B:
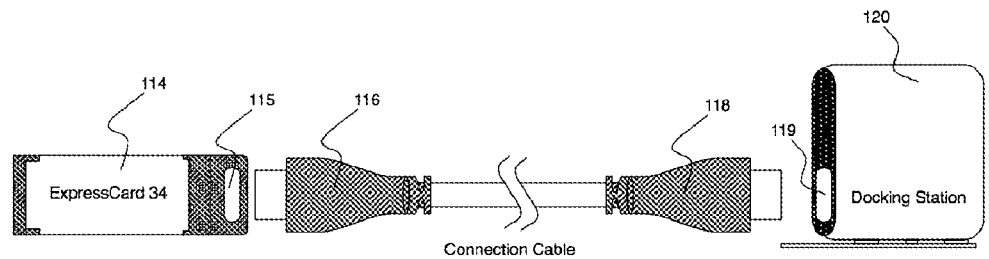
FIG. 1B: shows another prior art solution, showing an ExpressCard connection between a Docking Station and a computer.

As already described above with reference to the prior art, and with reference to FIG. 1A and FIG. 1B, for the known solutions it is common practice to feature two connector pairs 101, 102, 104, 105 (FIG. 1A) 115, 116 and 118, 119 (FIG. 1B) placed in the connection between two electronic devices 100 and 106 (FIG. 1A), 114 and 120 (FIG. 1B), implying an interruption of the electrical impedance through the connection.

Figure 1C:
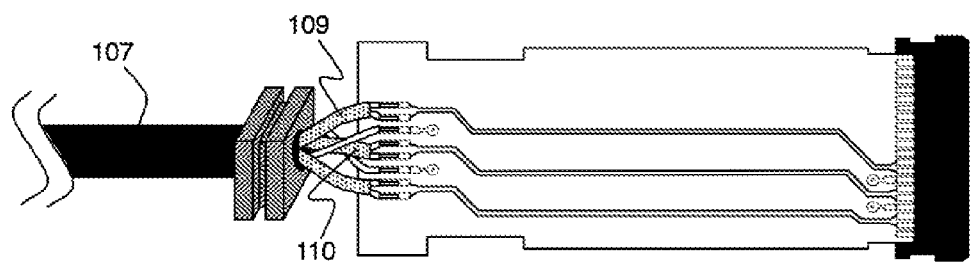
FIG. 1C: shows another prior art solution, showing a connection between a circular section cable and a PCB with high speed impedance matched traces.

Removing the connectors (FIG. 1C) there is a severe inconvenience due to having individual wires of the cable 107 having different lengths, violating the rule of the balanced length of the high speed electrical connections 109 and 110, not to mention the differences in the bad ground coupling and shielding schemas.

Figure 2A:
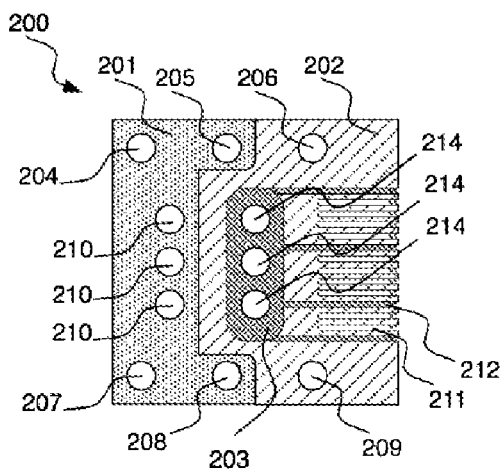
FIG. 2A: shows a first preferred embodiment of the invention, showing a top view of the Interconnection PCB only.
Figure 2B:
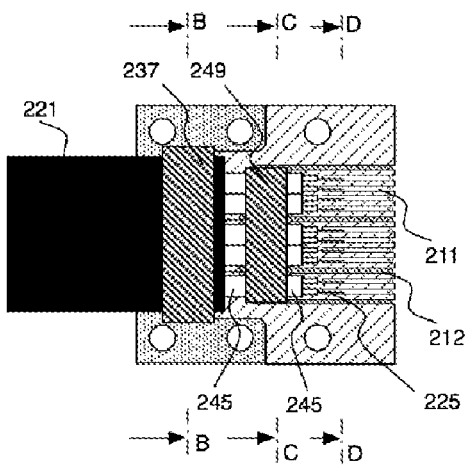
FIG. 2B: shows a top view of the Interconnection PCB as per FIG. 2A with the addition of a flat shaped electrical cable for high speed data transfer.

A detailed reference is now made to the preferred first embodiment of the present invention, as per FIGS. 2A trough 2J.

As generally known, cables used in these kind of applications (with circular or flat cross section) do include both critical wires (the ones carrying high speed information signals, in the described application made of wire couples with differential encoded signals, double shield, internal mylar and external threaded shield) 225, and not critical electrical wires, which carry slow information or electrical power that can then be treated without special care 244.

The process of connection between the flat cable, preferred for the invention, 221, and the Interconnection PCB 200 is designed to be executed by an electrical cable factory and allows an efficient quality control by means of simple unexpected short circuit or open circuit tests. The so prepared electrical cable can then be delivered to a different factory specialized in electronic component assembly and, by applying the technique of PCB edge soldering, the factory can solder the Interconnection PCB 200 to the target PCB 228 (shown in FIGS. 2F and 2G, detail 234, and in FIG. 2C), making in this way the final electrical connection, completing the coupling between the flat cable 221 and the Target PCB 228 without applying the traditional connector couple usually needed (one on the cable 221 and one on the Target PCB 228). To have removed, by the invention, the usual connectors couple allows to avoid the signal degradation that the connectors would have introduced. In case of an electronic device, the other end of the cable could be featuring this same solution as per the invention or a different embodiment of the invention as described further on in this document, or even an other known solution featuring a standard connectors couple.

Figure 2C:
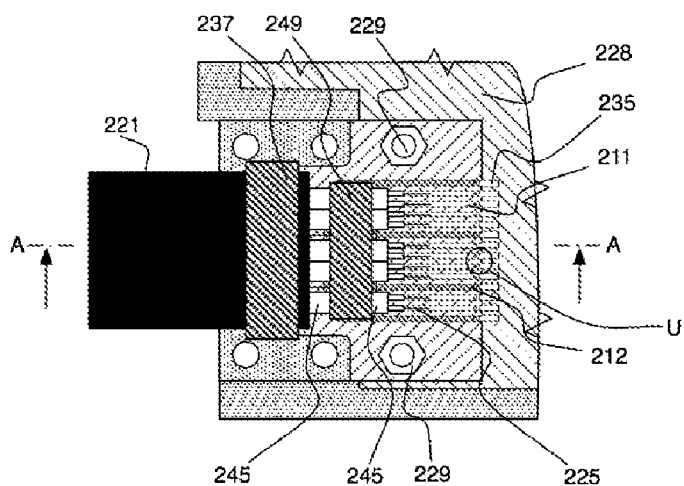
FIG. 2C: shows a further top view as per FIGS. 2A and 2B, with the addition of a partial view of the Target, placed below the Interconnection PCB.
Figures 2D, 2E:
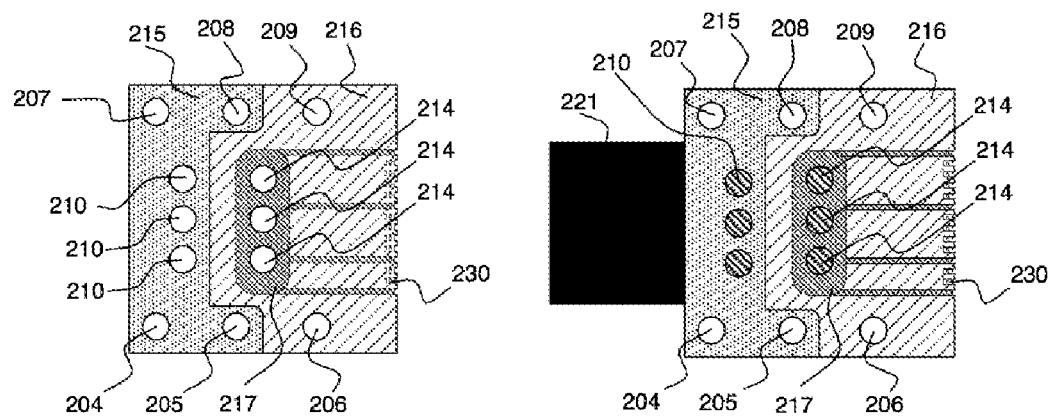
FIG. 2D: shows a bottom view of FIG. 2A.
FIG. 2E: shows a bottom view of FIG. 2B.
Figure 2F:
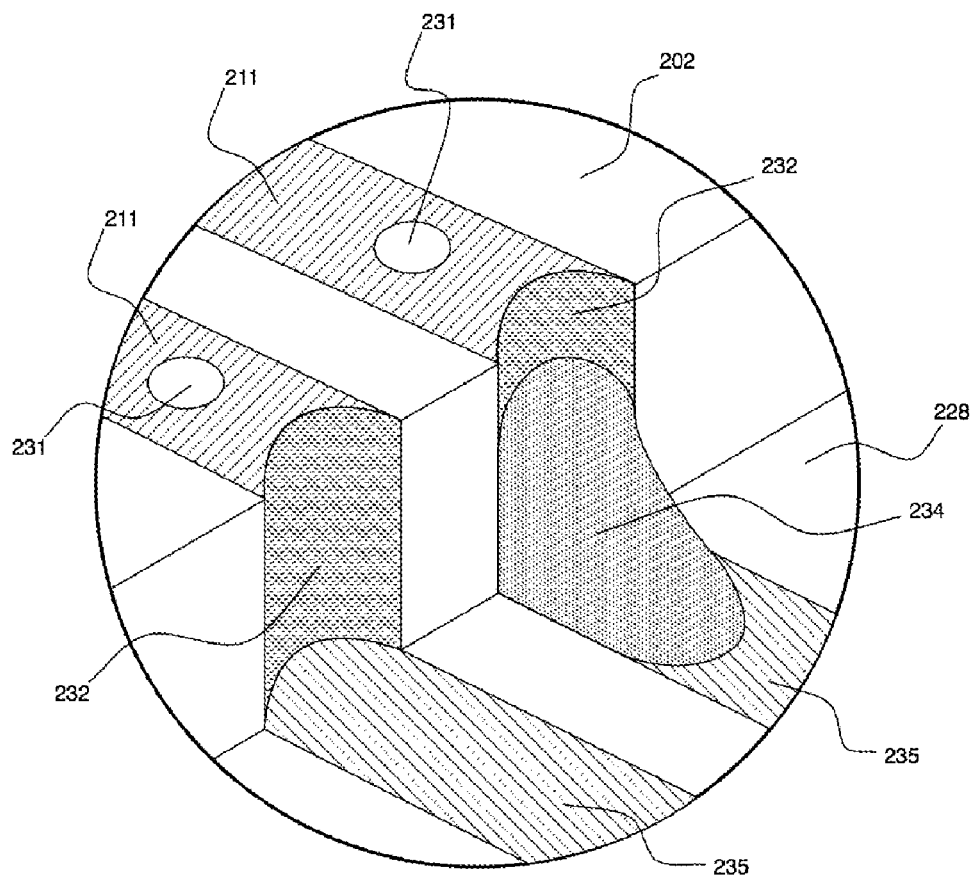
FIG. 2F: shows the detail U of FIG. 2C in an enlarged scale.
Figure 2G:
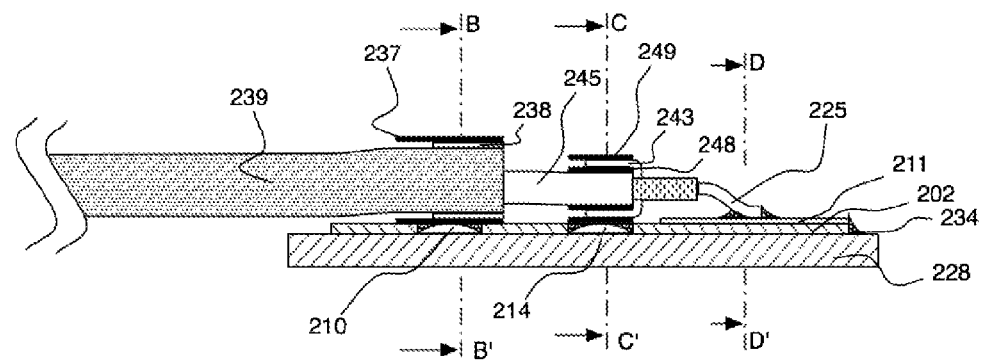
FIG. 2G: shows the cross section A-A of FIG. 2C.
Figure 2H:
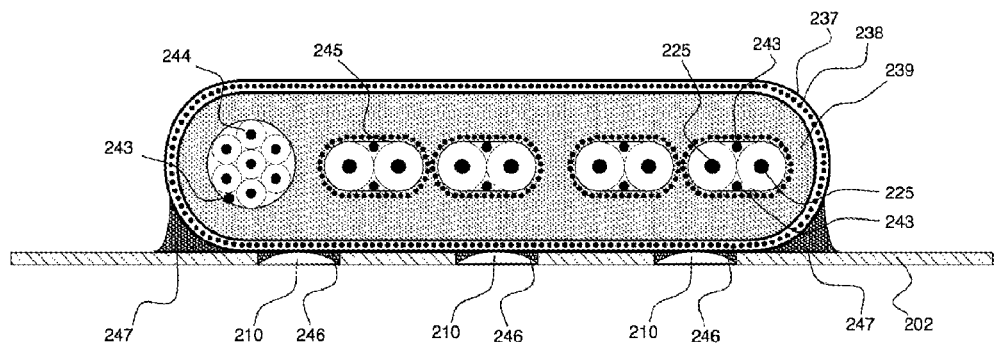
FIGS. 2H, 2I, 2J: show a cross sections B-B, C-C e D-D of FIG. 2B, respectively.
Figure 2I:
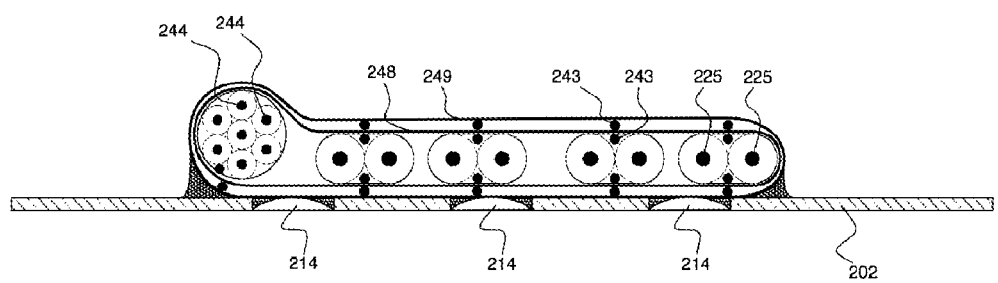
Figure 2J:
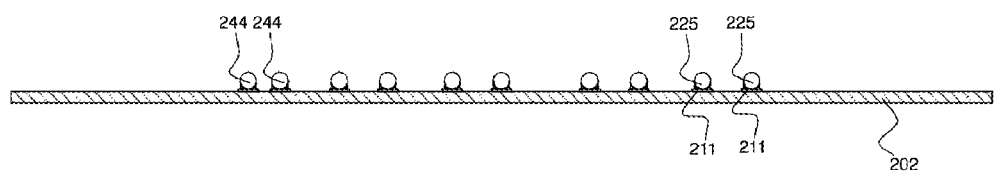

Reference is now made to FIG. 2A to 2J. This preferred embodiment is made of a cable of a preferred flat cross section 221 that includes electrical wires with matched impedance 225 with electrical reference to digital ground (DGND) made of an electrical shield 245 and a drain wire 243, soldered to the Intermediate PCB 200. The FIG. 2C shows the connection of the flat cable 221 to the Intermediate PCB 200 that is then soldered to the Target PCB 228. The connection between the cable and the Intermediate PCB is implemented in three different positions, clearly shown in the cross sections B-B, C-C and D-D. Among other advantages, this triple soldering cooperates to the good mechanical fit and avoids that overtime there could be a sliding effect of some wires in the cable. Practically, soldering phases can be supported by specific fixtures. Manual soldering time is in this way strongly reduced compared to the usage of traditional connectors and it is also possible to introduce a fully automated soldering process.

The cross section B-B (see FIGS. 2G and 2H) shows the connection of the most external shield thread 238 (CGND) of the flat cable 221 to the ground (CGND) of the Intermediate PCB 201 and makes the first fixing point of the cable to the Intermediate PCB. The shield thread 238 of the flat cable 221 is folded back on the external rubber insulation 239 of the cable itself. The folded thread 238 is then covered by conductive glued Copper tape 237, making in this way a mechanical retention contributing to keep the cable and its wires in place. This Copper Tape 237 is then soldered 246 from the bottom side through the holes 210 made for that purpose. Thanks to capillarity effect and adhesion properties of the solder tin (or similar soldering material) an additional soldering point 247 is made.

Cross section C-C (see FIGS. 2G and 2I) shows the connection of the internal shield thread 248 made of Copper thread or other conductive threaded material or Aluminum sheet or other conductive material sheet and the ground drain wires 243 to the digital ground (DGND) 203, 217 of the Intermediate PCB 200. The shield thread 248 is folded back on itself and then the drain wires 243 are folded on it. Then again conductive glued Copper Tape 249, becoming in this way an additional mechanical retention point, contributing to keep cable and wires in position. This Copper Tape 249 is soldered from the bottom side through the holes 214 made for that purpose.

Cross section D-D (see FIGS. 2G and 2J) shows the impedance matched wires 225 soldered to the impedance matched solder pads 211 foreseen on the Intermediate PCB 202. To be noted also the not critical wires 244 that are soldered in convenient locations with less care on the specific impedance-wise placement.

The Interconnection PCB 200 is a two layers printed circuit board, as thin as convenient (around 0,4 mm is the expected thickness) with trace with impedances matched and lengths balanced. The rightmost part 202, 216 is covered by an insulation layer, while the leftmost part 201, 215 leaves the ground copper exposed. The impedance matched and length balanced traces 211, with relative impedance referred to the digital ground (DGND) carried on the insulated traces 212, on which are soldered the impedance matched and length balanced wires 225, are ending on the rightmost side with a "c" shaped half through hole via-point, therefore covered with electrically conductive material in the thickness of the PCB 232 (see detail U). One additional complete through hole via-point is foreseen a few mm before the end of the trace 231. Together, these two trough hole via-points make a reliable galvanic connection between the traces 211 of the Interconnection PCB 200 and the traces 235 of the Target PCB 228 by means of soldering tin 234 or equivalent soldering material (see detail U, FIG. 2F.) The trace 211 on the upper side of the Interconnection PCB 200 continues on the profile 232 and on the bottom side 230 and continues on the bottom side 230 until a bit after the trough hole via point 231.

Figure 3:
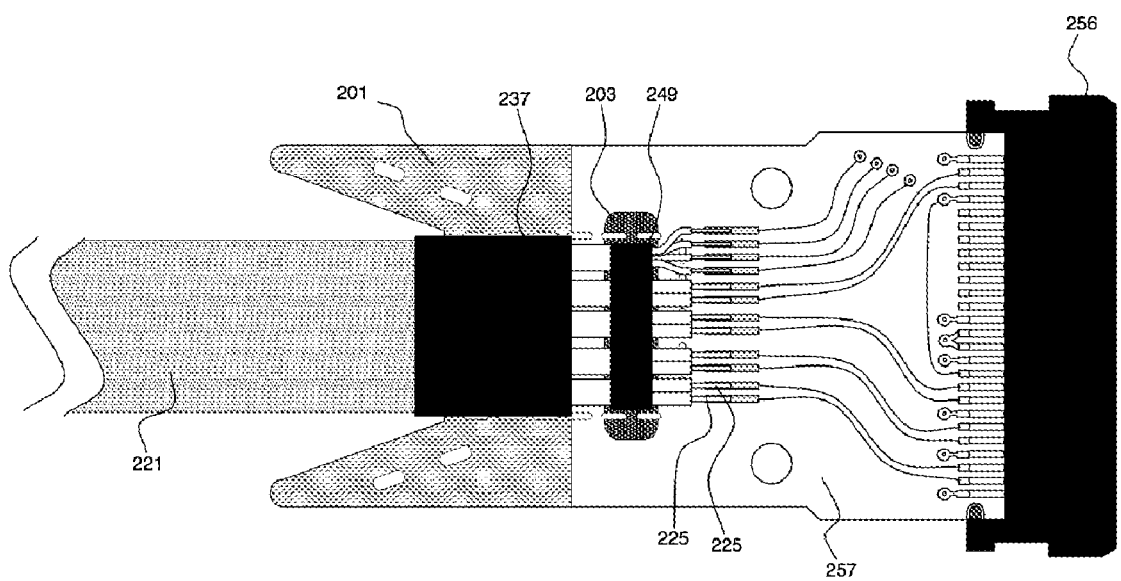
FIG. 3: shows a top view of a second embodiment of the invention.

To ensure the mechanical solidity of the connection, in addition to the three different soldering levels described, it is foreseen a mechanical retention solution implemented with appropriate holding holes 204, 205, 206, 207, 208 and 209 that allow to fix screws 229 or other retention solution, including chemical (electrical insulating glue, for example epoxy encapsulant), that block the two PCBs together and that can, optionally, hold also the cable and/or the individual critical wires tight to the PCBs. In FIG. 3 an additional possible embodiment of the Invention is shown, in which the cable 221 is connected to an Interconnection PCB 257 that is soldered to a connector 256 instead of a Target PCB 228 of the preferred embodiment. In this way, compared to prior art, it is still possible to reduce the number of total electrical interruptions on the overall connection, with advantages for the signal quality.

By the Invention, it is also foreseen to use just soldering pads or exposed PCB copper traces in place of a connector, with function of electrical contact points and connection, avoiding in this case to have a connector component, but still ensuring the same functionality, that is an improved connector is obtained.

According to the teaching of the invention the Target PCB could also be integrated in the Interconnection PCB.

From the above functional and structural description of an electrical connection between a cable and a printed circuit board for high data speed and high signal frequency according to the invention, it is readily apparent that with said electrical connection, the illustrated task is efficiently accomplished and the aforementioned advantages are achieved. It is understood that the invention may be embodied in other forms without departing from the scope thereof. Thus, the present examples and embodiments are to be considered in all respects as illustrative and not restrictive, and the invention is not to be limited to the details given herein. Those skilled in the art may introduce variations or modifications, for example by using cables with a round cross section or various interlock mechanical retentions between PCBs and/or cable, without thereby departing from the scope of the electrical connection according to the invention, as described, illustrated and claimed in the appended claims.

The invention claimed is:

1. A connection between an electrical cable for connecting electronic devices and a target printed circuit board ("PCB") for high data transfer speed and high signal frequency, comprising:

electrical cable for high speed data transfer, including non-critical wires, critical data wires, a ground conductor, an internal conductive shield surrounding the non-critical wires, the critical data wires, and the ground conductor, and an external threaded shield throughout a periphery surrounding the internal conductive shield, the external threaded shield being not electrically connected to the internal conductive shield, the critical data wires being both impedance matched and length balanced with each other, and an outermost insulating material around the external threaded shield; and an interconnection PCB with a top surface connected to an end portion of said electrical cable, comprising critical first traces and reference ground second traces extending in a lengthwise direction from the end portion of said electrical cable, each of said critical first traces being impedance matched and length balanced with each other, and each of said critical first traces being connected to a corresponding critical data wire of the end portion of said electrical cable by means of galvanic connections configured to maintain a continuity of electrical impedance between the critical data wires of said electrical cable and the target PCB of a target electronic device, wherein said electrical cable is fixed to said interconnection PCB at a first fixing point on the top surface via an end portion of the external threaded shield, wherein said electrical cable is fixed to said interconnection PCB at a second fixing point on the top surface via any of an end portion of the ground conductor and an end portion of the internal conductive shield, the second fixing point being spaced and electrically disconnected from the first fixing point in the lengthwise direction of the first and second traces, and wherein the galvanic connections connecting each of said critical first traces to a corresponding critical data wire of said electrical cable forms a third fixing point fixing said electrical cable to said interconnection PCB.

2. The connection according to claim 1, wherein the target PCB is incorporated in the interconnection PCB.

3. The connection according to claim 1, wherein said electrical cable has a flat cross section at least in a region of the critical data wires such that the critical data wires are aligned with each other in a single linear row along a length of said electrical cable, and wherein the critical data wires are configured to deliver high speed data and high signal frequency.

4. The connection according to claim 1, wherein the top surface of the interconnection PCB comprises a first portion having a first top surface of exposed conductive material, and a second portion side-by-side with the first portion, the second portion having a second top surface free of the exposed conductive material.

5. The connection according to claim 4, wherein said electrical cable is fixed at the first fixing point by way of a galvanic connection passing through a hole from the top surface to an opposite bottom surface of the interconnection PCB.

6. The connection according to the claim 1, wherein the interconnection PCB includes a through hole via in each of the critical first traces just before an end of the critical first traces connecting the interconnection PCB to the target PCB.

7. The connection according to claim 6, wherein said electrical cable is fixed at the first fixing point by way of a galvanic connection passing through a hole from the top surface to an opposite bottom surface of the interconnection PCB.

8. The connection according to claim 1, wherein said electrical cable is fixed at the first fixing point by way of a galvanic connection passing through a hole from the top surface to an opposite bottom surface of the interconnection PCB.

9. The connection according to claim 1, wherein said interconnection PCB further comprises contact points made of conductive portions at one or more edges of the interconnection PCB configured to engage via galvanic connection with corresponding soldering pads of the target PCB at a base of the one or more edges such that the interconnection PCB forms an intermediate connection between the cable and the target PCB.

10. The connection according to claim 9, wherein said contact points at the one or more edges each comprise a C-shaped half through hole via configured to receive a conductive trace connecting the interconnection PCB with the target PCB.

11. The connection according to claim 1, wherein the first fixing point is affixed to an end portion of the threaded shield folded back upon an end portion of the outermost insulating material of said electrical cable.

12. The connection according to claim 11, wherein the end portion of the threaded shield folded back upon the end portion of the outermost insulating material is covered by conductive material affixed to the first end portion by a galvanic connection penetrating a hole through to a bottom side of said interconnection PCB.

13. A connection between an electrical cable for connecting electronic devices for high data transfer speed and high signal frequency, comprising:

electrical cable for high speed data transfer, including non-critical wires, critical data wires, a ground conductor, an internal conductive shield surrounding the non-critical wires, the critical data wires, and the ground conductor, and an external threaded shield throughout a periphery surrounding the internal conductive shield, the critical data wires being both impedance matched and length balanced with each other, and an outermost insulating material around the external threaded shield;

an interconnection printed circuit board ("PCB") with a top surface connected to an end portion of said electrical cable, comprising first traces and reference ground second traces extending in a lengthwise direction from the end portion of said electrical cable to an edge portion of the interconnection PCB; and a target PCB having target traces connected to corresponding the first and second traces of the interconnection PCB, wherein each of said first traces are impedance matched and length balanced with each other, and each of said first traces are connected to a corresponding critical data wire of the end portion of said electrical cable by means of galvanic connections configured to maintain a continuity of both electrical impedance and length balancing of the critical data wires of said electrical cable, wherein said electrical cable is fixed to said interconnection PCB at a first fixing point on the top surface via an end portion of the external threaded shield, and wherein the galvanic connections connecting each of said first traces to a corresponding critical data wire of said electrical cable forms a second fixing point fixing said electrical cable to said interconnection PCB.

14. The connection according to claim 13, wherein the interconnection PCB is fixed to the target PCB via holding holes through the interconnection PCB configured to receive any of adhesives and fasteners.

15. The connection according to claim 13, wherein the first and second traces have connections, at the edge portion of the top surface of the interconnection PCB, to corresponding traces of the target PCB, the connections comprising electrically conductive material over the edge portion and extending from the interconnection PCB to the target PCB.

16. The connection according to claim 13, wherein the target PCB is incorporated in the interconnection PCB.

17. The connection according to claim 13, wherein the target PCB further comprises a connector, and wherein terminal ends of the target traces are connected to the connector.

18. The connection according to claim 13, wherein terminal ends of the target traces terminate with exposed conductive traces for connection with an electronic device.

19. The connection according to claim 13, wherein the top surface of the interconnection PCB comprises a first portion having a first top surface of exposed conductive material, and a second portion side-by-side with the first portion, the second portion having a second top surface free of the exposed conductive material.

20. The connection according to claim 13, wherein said electrical cable is fixed to said interconnection PCB at a third fixing point on the top surface via any of an end portion of the ground conductor and an end portion of the internal conductive shield, the third fixing point being spaced and electrically disconnected from the first fixing point in the lengthwise direction of the first and second traces.

* * * * *